US006682872B2

(12) United States Patent
Sachdev et al.

(10) Patent No.: US 6,682,872 B2
(45) Date of Patent: Jan. 27, 2004

(54) UV-CURABLE COMPOSITIONS AND METHOD OF USE THEREOF IN MICROELECTRONICS

(75) Inventors: Krishna G. Sachdev, Hopewell Junction, NY (US); Michael Berger, New Paltz, NY (US); Rebecca Y. Gorrell, Lagrangeville, NY (US); Gregg B. Monjeau, Wallkill, NY (US); Bernadette H. Perry, Wappingers Falls, NY (US); Thomas A. Wassick, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/056,245

(22) Filed: Jan. 22, 2002

(65) Prior Publication Data

US 2003/0138733 A1 Jul. 24, 2003

(51) Int. Cl.[7] .................................................. G03C 5/00
(52) U.S. Cl. .................... 430/311; 430/270.1; 430/905; 430/913; 428/424.7; 428/424.8; 428/522
(58) Field of Search .............................. 430/311, 270.1, 430/905, 913; 428/424.7, 424.8, 522

(56) References Cited

U.S. PATENT DOCUMENTS

| 4,533,445 A | 8/1985 | Orio ...................... 204/159.19 |
| 4,544,623 A | 10/1985 | Audykowski et al. ...... 430/280 |
| 4,614,704 A | 9/1986 | Hung et al. ................. 430/284 |
| 4,902,578 A | * 2/1990 | Kerr, III ..................... 428/522 |

* cited by examiner

*Primary Examiner*—Mark F. Huff
*Assistant Examiner*—Daborah Chacko-Davis
(74) *Attorney, Agent, or Firm*—DeLio & Peterson, LLC; John J. Tomaszewski; James J. Cioffi

(57) ABSTRACT

Radiation-curable compositions are provided for use in the fabrication of electronic components as passivation coatings; for defect repair in ceramic and thin film products by micropassivation in high circuit density electronic modules to allow product recovery; as a solder mask in electronic assembly processes; for use as protective coatings on printed circuit board (PCB) circuitry and electronic devices against mechanical damage and corrosion from exposure to the environment. The compositions are solvent-free, radiation-curable, preferably uv-curable, containing a polymer binder, which is a pre-formed thermoplastic or elastomeric polymer/oligomer, a monofunctional and/or bifunctional acrylic monomer, a multifunctional (more than 2 reactive groups) acrylated/methacrylated monomer, and a photoinitiator, where all the constituents are mutually miscible forming a homogeneous viscous blend without the addition of an organic solvent. The compositions may also contain inorganic fillers and/or nanoparticle fillers.

20 Claims, No Drawings

UV-CURABLE COMPOSITIONS AND METHOD OF USE THEREOF IN MICROELECTRONICS

BACKGROUND OF THE INVENTION

1. Field of the Invention

This invention relates generally to radiation-curable compositions based on a mixture of organic constituents or organic-inorganic hybrid systems for use in the fabrication of electronic components, and, in particular, as multipurpose coatings, such as passivation coatings; for defect repair in ceramic and thin film products by micropassivation in high circuit density electronic modules to allow product recovery; as a solder mask in electronic assembly processes; for use as protective coatings on printed circuit board (PCB) circuitry and electronic devices against mechanical damage and corrosion from exposure to the environment.

2. Description of Related Art

A number of uv-curable compositions for use as protective coatings and PCB solder mask applications in low temperature soldering processes for component attachment have been described in the literature and many of such uv-curable materials are commercially available. In the solder mask application, for example, the solder mask composition covers the selected areas of the printed wiring board (PWB) circuitry allowing selective soldering of the areas which are not covered by the mask and prevents solder bridges. The solder mask is typically kept permanently in place to provide long term insulation and protection against mechanical and environmental damage.

U.S. Pat. No. 4,533,445 (Orio et. al.) describes a uv-curable solder mask composition with good adhesion to copper and Pb—Sn solder, comprising an epoxy resin, an acrylated monomer/oligomer, a photoinitiator, and an inorganic filler. These compositions are screen printed onto circuit boards.

U.S. Pat. No. 4,544,623 (Audykowski et al.) discloses photosensitive coating compositions and use thereof for protective purposes such as a solder mask on a PWB. These compositions contain organic solvents and are based on a photosensitive epoxide resin carrying an ethylenically unsaturated group bound as a side chain or a molecular chain as chalcone group, a customary curing agent, a cure accelerator and an organic or inorganic filler.

U.S. Pat. No. 4,614,704 (Hung et.al.) describes a uv-curable composition comprising triphenyl phosphite for forming solder mask coatings of high cure depth.

The uv-curable compositions described in the art are generally based on epoxide resin, epoxide/acrylic resins or epoxide/acrylated urethanes, which also carry organic solvents in some cases. The problem with epoxy based crosslinked thermoset materials as protective coatings on organic, inorganic, and metal surfaces is that these are high stress, high modulus and generally brittle materials which also have the problem of high moisture uptake. The presence of organic solvents in uv-curable formulations also has several problems, for example, solvent outgassing during cure, flammability, chemical safety, and health hazard when using low boiling solvents. In addition, some of the solvents are classified as VOC (Volatile Organic Compounds) or HAPs (Hazardous Air Pollutants), which are subject to environmental regulations requiring strict control of volatile emissions using special emission control devices and which in some cases require record keeping and regular reporting of emissions.

Bearing in mind the problems and deficiencies of the prior art, it is therefore an object of the present invention to provide solvent-less, radiation-curable, particularly uv-curable, compositions, which contain all organic components and, which compositions are for use in the fabrication of electronic components such as for use as passivation coatings on electronic components, for micropassivation to repair defects and carry out engineering changes in assembled high circuit density electronic modules, and thereby allowing product recovery and cost reduction by preventing yield loss.

It is another object of the present invention to provide solvent-free, radiation-curable, particularly uv-curable, organic-inorganic hybrid compositions to form filler-reinforced polymer composites for use in the fabrication of electronic components such as for defect repair and carry out engineering changes in ceramic and thin film structures of assembled high cost high circuit density electronic modules to provide recovery of finished product which otherwise would be discarded adding to the overall product cost and increasing the product waste.

Another object of this invention is to provide a method of use of these compositions in the fabrication of electronic components such as passivation and protective coatings on PWB circuitry and for protection of electronic devices against mechanical damage and corrosion from exposure to the environment.

Yet another object of this invention is to provide solvent-free, radiation-curable, particularly uv-curable, nanocomposite compositions, using organically modified inorganic nano-fillers in a uv-curable organic binder system and use of these nanocomposite compositions in the fabrication of electronic components such as for micropassivation and to repair defects or imperfections in ceramic and thin film products in high circuit density ceramic modules to provide waste reduction and cost reduction by product recovery and recycle.

A further object of the present invention is to provide solvent-free, radiation-curable, particularly uv-curable, polymer-filler composite compositions using conventional inorganic and/or organic fillers, polymer-nanofiller nanocomposites and use thereof in microelectronics fabrication, such as, solder mask in electronic component assembly processes; uv-curable passivation and protective coatings for device protection against mechanical damage and detrimental effects of environmental exposure, and for defect repair in assembled high circuit density electronic modules.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, solvent-free, radiation-curable, preferably uv-curable, compositions formed by blending a polymer binder, which is a pre-formed thermoplastic or elastomeric polymer/oligomer, a monofunctional and/or bifunctional acrylic monomer, a multifunctional (more than 2 reactive groups) acrylated/methacrylated monomer, and a photoinitiator, where all the constituents are mutually miscible forming a homogeneous viscous blend without the addition of an organic solvent.

In another aspect of the invention radiation-curable, preferably uv-curable organic-inorganic hybrid compositions, are provided that are formed by dispersing an inorganic filler in the above compositions to provide polymer-filler composite compositions and nanocomposite compositions depending on the type of filler used.

These compositions may also contain other additives, for example, surfactants, coloring agents, adhesion promoters, antioxidants, and corrosion inhibitors.

In a further aspect, these compositions are applied on the desired area by standard methods of syringe dispensing, spraying, roller coating, or screen printing, and subjected to curing by exposure to uv according to conventional methods, which can optionally be followed by a thermal cure for crosslinking any residual reactive species, e.g., monomeric and/or oligomeric species.

In a further aspect of the invention, a method is provided for repairing defects in high circuit density electronic modules for product recovery so as to provide product cost reduction by preventing yield loss and reduce waste. For thin film repair in advanced high circuit density ceramic modules, the uv curable composition is selectively dispensed on the defect site of the electronic module, cured by exposure to uv-radiation, subjected to laser ablation to expose the embedded defect region through the uv cured material, and repairing the underlying defect by making engineering changes for product recovery.

In another aspect of the invention, the uv-curable compositions are used as a solder mask for selective coverage of PWB circuitry by adjusting the viscosity for screen printing, thus allowing selective soldering of areas which are not covered by the mask and preventing the solder bridges. After soldering processes and component attachment onto a circuit board, the uv cured solder mask can remain as a passivation/insulation coating to provide protection against the detrimental effects of environmental exposure and mechanical damage.

In a further aspect of the invention, preferred above uv-polymerizable compositions are provided for use in product recovery and waste reduction by defect repair and reuse, micropassivation, and protective coatings on ceramic and plastic electronic modules, and for selective soldering in printed circuit board and other such uses, comprising:

an organic polymeric/oligomeric binder system selected from the group consisting of:

(a) poly(acrylonitrile-co-butadiene-co-acrylic acid) having reactive terminal functional groups represented by the chemical structure I;

Structure I.

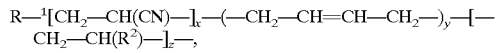

where $R^1$ and $R^2$ can be

—COO—CH$_2$—CH(OH)—CH$_2$—O—CO—C(R')=CH$_2$;

—COOH; and

—COOR";

or mixtures thereof; and where R is H or CH$_3$ and R" is an organic radical represented by $C_nH_{2n+1}$, n=1 to 4;

(b) poly(acrylonitrile-co-butadiene) amine terminated, such as a bifunctional secondary amine, or a dicarboxy terminated oligomeric elastomer represented by chemical structure II;

Structure II:

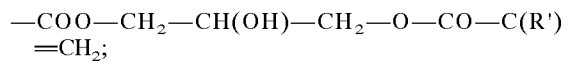

where $R^3$ and $R^4$ can be —CONH—CH$_2$—CH$_2$—NC4H8NR';

—COOH, and

—COOR";

or mixtures thereof;

and R' is H or CH$^3$; and where R" is an organic radical represented by $C_nH_{2n+1}$, n=1 to 4;

(c) polybutadiene epoxy/hydroxy functionalized, represented by chemical structure III, and mixtures thereof;

Structure III:

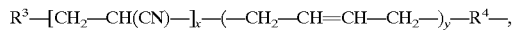

(d) acrylate polymers of the type poly(styrene-co-butyl methacrylate-co-ethyl methacrylate); poly(methyl vinyl ether); poly(ethyl acrylate-glycidyl methacrylate-methacrylic acid-methyl methacrylate), poly(styrene-glycidyl methacrylate-ethyl acrylate) and mixtures thereof;

a monofunctional and/or bifunctional acrylic monomer such as hydroxyethyl acrylate, glycidyl methacrylate, hydroxyethyl methacrylate, ethoxylated bis-phenol-A-diacrylate and 2,2-bis(4-methacryloxyphenyl) propane and mixtures thereof;

a polyfunctional acrylate monomer (having more than 2 functional groups) such as trimethylolpropane triacrylate (TMPTA), trimethylolpropane trimethacrylate (TMPTMA), propoxylated trimethylolpropane triacrylate PO/OH TMPTA), pentaerythritol tetracrylate, dipentaerythritol pentaacrylate and mixtures thereof; and a photoinitiator such as the commonly used benzophenone, benzoin, acetophenone, ethyl benzoin, 4,4-bis-dialkylamino benzophenone, 1-hydroxy-cyclohexyl phenyl ketone, 1,2-benzal anthraquinone, 2-ethyl anthraquinone, anthracene methanol and Irga-cure family of cross-linking reagents.

In another aspect of this invention, the photoinitiator can be polymer-bound or which carries an acrylate functional group bonded to the chromophoric molecule so that upon uv exposure of the formulation, it can serve its usual function of energy transfer to initiate polymerization of the reactive species in the composition and at the same time undergo crosslinking reaction with the composition constituents to become an integral part of the cured matrix. Exemplary are 4-methacryloxy-2-hydroxy benzophenone, 4-(2-acryloxy ethoxy) 2-hydroxy benzophenone, 2-(2'-methacryloxy-5'-methylphenyl) benzotriazole, which acrylate containing photoinitiators have the advantage of preventing or minimizing photoinitiator outgassing during thermal exposure.

In another aspect of the invention, the above compositions can be used with:

a conventional inorganic filler such as the commonly used magnesium silicate or talc, mica, silica, alumina, fumed silica, silane coated silica to provide a hydrophobic surface, and mixtures thereof; and/or a nano-filler such as the organically modified montmorillonite (mmt.) clay, magnesium alumino-silicate smectites or bentonite clay, for example, alkyl quaternary ammonium mmt. or alkyl quaternary ammonium bentonite, where the organic modification transforms the hydrophilic natural nanoclay surface to hydrophobic or organophilic surface and thus providing compatibility with organic binder system for stable organic binder-clay dispersion.

Upon uv curing of the composition according to this invention, the organic binder-organically surface modified nanofiller dispersion forms uv-cured organic-inorganic nanocomposites with superior properties and improved performance for use in defect repair, passivation or insulation and protective coatings on ceramic and plastic electronic components. There have been several studies on polymer-clay nanocomposites with epoxy resins, polystyrene, nylon, and polyimides which have shown toughening by nanofiller due to polymer reinforcement, increase in tensile modulus, decrease in thermal expansion, and decrease in permeability to oxygen, water vapor, and other gases. The organically surface modified nanoclays as plastic reinforcement additives are commercially available, for example from Southern Clay Products, Inc., Nanocor Inc., and other sources, and can also be readily prepared by cation exchange of $Na^+$ mmt i.e. the natural montmorillonite sodium form, by cation exchange of the $Na^+$ cations on the surface with a desired alkyl quaternary ammonium halide or sulfate, for example, hexadecyl trimethyl ammonium chloride or bromide, and subsequent removal of unreacted organic material by washing with alcohol, filtration, and drying to recover the hydrophobically surface modified montmorillonite clay nanofiller.

DESCRIPTION OF THE PREFERRED EMBODIMENT(S)

The present invention is generally concerned with solvent-free, radiation-curable, preferably uv-curable compositions, polymerization by exposure to, for example uv radiation, to provide a cured polymer, polymer-filler composite or a polymer-nanofiller nanocomposite, and a method for using these compositions to repair ceramic and thin film defects in high density circuit electronic modules to provide product recovery and thereby cost reduction, prevent yield loss, and reduce waste. The invention is also concerned with the use of these uv-curable compositions as a solder mask according to standard methods of solder mask processing for selective coverage of PWB circuitry by adjusting the viscosity for screen printing, thus allowing selective soldering of areas which are not covered by the mask and preventing solder bridges. After soldering processes and component attachment onto circuit board, the uv cured polymer or polymer-filler composite layer remains as a passivation/insulation coating to provide protection against the detrimental effects of environmental exposure and mechanical damage.

For thin film repair in advanced high-density ceramic modules with thin film structure, the uv curable composition is selectively dispensed on the defect site, cured by exposure to uv-radiation, the embedded defect area opened by selective laser ablation of the uv-cured material, and repairing the underlying defect by making engineering changes for product recovery.

For use of the uv-curable compositions according to this invention in repairing defects on the flange area of the ceramic module on the top side such as hoop-cracks, chipped ceramic, and depressions, the uv-polymerizable solvent-free composition is dispensed over the defect site, cured by uv exposure to provide permanent sealing or micropassivation of the defects. The topside flange is needed to hermetically seal or cap the package circuitry for protection from mechanical damage and the detrimental effects of environmental exposure. Without repair of the flange related defects, the modules are rejected as these do not meet the ceramic flange manufacturing specifications. The uv-curable materials of this invention meet all the bond and assembly processing requirements, for example, resistance to rosin flux; withstand high temperature chip join temperature up to 350–375° C. for less than 5 minutes; low temperature soldering process, for example eutectic lead-tin solder at about 200 to about 220° C. or lead-free solder joining for example at about 230 to about 260° C. for less than 5 minutes; flux residue cleaning processes, for example, with exposure to xylene/isopropanol (IPA) for less than 10 minutes at 75–85° C.; adhesion to Au, Pb/Sn solder, lead-free solder alloys, polyimide insulator, and to ceramic; laser ablation process to expose underlying defect site for engineering changes; and resistance to the thermal stress induced during reliability test exposure.

The solvent-free, uv-curable compositions according to the present invention are formed by blending an organic binder which is a pre-formed elastomeric or thermoplastic polymer/oligomer, a monofunctional and/or bifunctional acrylic monomer, a multifunctional acrylated/methacrylated monomer, and a photoinitiator, where all the constituents are mutually miscible forming a homogeneous viscous blend without the addition of an organic solvent.

The invention is further concerned with uv-curable organic-inorganic hybrid compositions formed by dispersing an inorganic filler, which can be a conventional inorganic filler and/or an organically modified nanoparticle-filler, in the uv-polymerizable organic binder composition which upon uv-exposure provides a crosslinked matrix of polymer-filler composites and nanocomposites depending on the type of filler used. The uv-curing step may be followed by thermal curing to crosslink or polymerize any residual reactive species. For providing cured thermoset polymer deposit or coating over the electronic component for protection/passivation, the uv curable composition is applied on the desired area by standard methods of syringe dispensing, spraying, roller coating, or screen printing, and subjected to curing by exposure to uv according to conventional methods, followed by a thermal cure if necessary. The uv-curable compositions according to this invention may also contain other additives, for example, surfactants, coloring agents, adhesion promoters, antioxidants, and corrosion inhibitors.

The organic polymeric/oligomeric binder system is preferably of the type, poly(acrylonitrile-co-butadiene-co-acrylic acid) dicarboxy terminated glycidyl methacrylate diester (Structure I, where $R^1$ and $R^2$=—COO—$CH_2$—CH (OH)—$CH_2$—O—CO—C(R')=$CH_2$, and $R^1$=$CH_3$); having about 18% (wt %) acrylonitrile segment with less than 1% (wt. %) residual acrylic acid groups, and having a viscosity in the range about 2000–3000 Poise and a Tg of −49° C.; or $R^1$ and $R^2$ in structure I=—COOH, —COOR", where R" is an organic radical represented by CnH2n+1, n=1 to 4.

A representative material is sold by Aldrich Chemical under the Product Number 418927 and is termed Poly (acrylonitrile-Co-butadiene-Co-acrylic acid), dicarboxy terminated, glycidyl methacrylate. The CAS Number is 118578-03-3 and the MDL Number is MFCD00081277.

Another representative material is Aldrich Product Number 418889 where $R^1$ and $R^2$ are COOH. The CAS Number is 68891-50-9 and MDL Number MFCD00081277. The average molecular weight is 3600, contains 18 wt. % acrylonitrile and 2.4 carboxyl groups. The viscosity is 1600 poise at 27° C.(Brookfield) and the Tg is −52° C.

Another representative binder system is a poly (acrylonitrile-co-butadiene) amine terminated bifunctional secondary amine oligomeric elastomer (Structure II where $R^1$ and $R''=$—CONH—$CH_2$—$CH_2$—$NC_4H_8NR'$, where $R'=H$) having 18% (wt %) or 10% (wt %) acrylonitrile segment in the copolymer and viscosity about 2000 Poise at 27° C. (Brookfield), a Tg of −51° C. and an Amine E.W. of 900, and a viscosity of about 1800 poise, a Tg of −65° C. and amine E.W. of 1200, respectively. The Aldrich Product Number is 418900, the CAS Number is 68683-29-4 and the MDL Number MFCD00133994.

Another representative binder system is a polybutadiene epoxy/hydroxy functionalized polymer (Structure III), having a viscosity in the range of about 50 to about 250 Poise and molecular weight about 2000–3000.

Other polymer binder systems that can also be used are the acrylate polymer binders of the type poly(styrene-co-butyl methacrylate-co-ethyl methacrylate); poly(methyl vinyl ether); poly(ethyl acrylate-glycidyl methacrylate-methacrylic acid-methyl methacrylate); poly(styrene-co-isobornyl acrylate-co-glycidyl methacrylate), and related copolymer and terpolymer systems.

Various monofunctional and bifunctional acrylic monomers that can be used for the purpose of this invention include: hydroxyethyl acrylate, hydroxyethyl methacrylate, ethoxylated bis-phenol A diacrylate, hexanediol diacrylate, 2-ethylhexyl acrylate, methyl methacrylate, cyclohexyl acrylate, butyl methacrylate, 2-phenoxy ethyl acrylate, 2-phenoxy ethyl methacrylate, 2,2-bis(4-ethacryloxyphenyl) propane, 2,2-bis(4-methacryloxyphenyl)propane, 2,2-bis[4-(2-acryloxyethoxy)phenyl] propane, isobornyl acrylate, isobornyl methacrylate, styrene monomer, acetoxy styrene monomer, and related acrylic monomers, and acrylic-epoxy monomers such as glycidyl acrylate, glycidyl methacrylate, allyl glycidyl ether, and related reactive monomers which are well known in the art and are commercially available, and mixtures thereof.

Polyfunctional acrylate monomers (having more than 2 functional groups) preferred according to this invention are: trimethylolpropane triacrylate (TMPTA), trimethylolpropane trimethacrylate (TMPTMA), propoxylated trimethylolpropane triacrylate PO/OH TMPTA), pentaerythritol tetracrylate, and mixtures thereof, which are well known in the art.

Preferred photoinitiators for the solvent-less uv-curable compositions described herein are the commonly used photoinitiators, for example, benzophenone, acetophenone, benzoin, ethyl benzoin, 4,4-bis-dialkylamino benzophenone, 1-hydroxy-cyclohexyl phenyl ketone, 1,2-benzal anthraquinone, 2-ethyl anthraquinone, anthracene methanol. In another aspect of this invention, the photoinitiator can be polymer-bound and/or which carry acrylate or other functional group bonded to the chromophoric molecule so that upon uv exposure of the formulation, it can serve its usual function of energy transfer to initiate acrylate polymerization of the reactive species in the composition and at the same time undergo crosslinking reaction with the composition polymer matrix to become an integral part of the cured matrix, for example, 4-methacryloxy-2-hydroxy benzophenone, 4-(2-acryloxy ethoxy) 2-hydroxy benzophenone, 2-(2'-methacryloxy-5'-methylphenyl) benzotriazole, which has the advantage of preventing photoinitiator outgassing during thermal exposure, and more preferably photoinitiators which have covalently bonded acrylate side chain and chromophore moiety, for example, allylic or vinyl functional group carrying chromophoric compounds represented by 4-methacryloxy-2-hydroxy benzophenone, 4-(2-acryloxy ethoxy) 2-hydroxy benzophenone 4-vinyl anthracene, 2-(2'-methacryloxy-5'-methylphenyl) benzotriazole, such that upon uv exposure of the coating on substrate using I-line, deep uv, or broad band uv irradiation lamp source, its chromophoric segment serves its usual function of uv absorption and energy transfer to the reactive species of the composition to initiate polymerization and at the same time it itself can undergo crosslinking reaction with the composition constituents to become an integral part of the cured matrix. It is also preferred that the photoinitiator be polymer-bound as it can have the advantage of preventing photoinitiator outgassing during thermal exposure.

Other formulation additives that can be used in conjunction with constituents described above include:

an adhesion promoter of the type organosilanes, for example, gamma-aminopropyl triethoxysilane, organotitanates, polymerizable group carrying silanes such as epoxy and vinyl functionalized alkoxysilanes, for example, vinyl trialkoxysilane, vinyl triacetoxysilane, glycidoxypropyl triethoxysilane, gamma-methacryloxypropyl trimethoxysilane;

a coloring agent or a dye for providing contrast of the uv-curable composition on a substrate, the dye is selected such that it forms a miscible blend with the formulation, is thermally stable and maintain contrast during uv-curing and any subsequent thermal processing either by retaining original color or by color change if that occurs;

a surfactant or surface-active agent to provide formulation stability with no phase separation during storage, and to provide optimum wetting of the surface on which the composition is applied.

The inorganic fillers can be of conventional type such as magnesium silicate or talc, mica, silica, alumina, aluminum silicate, fumed silica, silane modified silica to provide a hydrophobic surface for compatibility with the organic binder system, and mixture thereof. These inorganic fillers can be in the range from about 10% to about 40% or more (by weight of the total composition), preferably in the range 15–30%, have an average particle size preferably less than 10 um, more preferably less than 5 um. The nanofiller for use in forming nanocomposites, for example, the organically modified Montmorillonite Clay, is used in the range of about 1% to about 15% or more, preferably in the range of about 3% to about 10% (by weight of the total composition).

The viscosity of these compositions can be adjusted by modifying the relative ratio of the reactants to the desired application method such as dispensing, roller coating, or screen printing.

We have found that both the filled and the unfilled uv-curable compositions of this invention undergo rapid polymerization upon exposure to uv radiation to give essentially transparent nanocomposite cured product or with no added filler while, with the conventional filler such as talc, a somewhat opaque composite cured product is formed.

The cured product in each type composition shows excellent adhesion to ceramic, polyimide insulator, Au, Pb/Sn solder, and thin film metallurgy, and is capable of withstanding Bond and assembly processing including prolonged contact with rosin flux, a few minutes of high temperature exposure, for example, higher than 300° C., during chip join conditions, flux residue cleaning using xylene/IPA for less than 10 minutes each at 70–85° C., with no visible change such as degradation, cracking or delamination.

The nanoparticle fillers for use in conjunction with the organic constituents referred to above for the purpose of this invention are in the category of organically surface modified montmorillonite (mmt.) or bentonite clay, for example, tetra alkyl ammonium mmt, quaternary ammonium mmt, tetra alkyl ammonium bentonite, or quaternary ammonium bentonite. Interaction of organically modified layered silicates with polymers leads to nanocomposites.

The organic modification generally involves exchanging the $Na^+$ cation on the surface of natural clay with a hydrophobic alkyl ammonium (or quaternary ammonium) cation, octadecylammonium (C18) cation, dimethyl dioctadecylammonium (2C18) cation, or hexadecyl trimethylammonium cation which transforms the hydrophilic natural clay surface to hydrophobic or an organophilic surface and imparts compatibility with the organic binder system resulting in a homogeneous and stable dispersion of the modified nanoclay with the organic binder system. Organically modified nanoclay layered silicates are commercially available which are generally of the type $R_1R_2R_3R_4N^+$. mmt, where at least one of the $R_1$, $R_2$, $R_3$, or $R_4$ groups represents a long chain hydrophobic moiety such as C18 or tallow exchanged mmt.

Incorporation of these nanofillers in the uv-curable compositions according to this invention forms an organic binder-organically modified nanofiller dispersion which upon uv curing results in the formation of organic-inorganic nanocomposites with superior properties and improved performance in their use for ceramic electronic module defect repair, passivation and protective coatings on ceramic and plastic electronic components. There have been several studies on polymer-clay nanocomposites with epoxy resins, polystyrene, nylon, PMMA, and polyimides which have shown toughening by nanofiller due to polymer reinforcement, increase in tensile modulus, increase in heat distortion temperature, decrease in thermal expansion, and decrease in permeability to oxygen, water vapor, and other gases. The organically modified nanoclay candidate materials as plastic reinforcement additives are commercially available, for example from Southern Clay Products, Inc., Nanocor, and other sources, and can also be readily prepared by cation exchange of $Na^+$ mmt (Southern Clay Products) by cation exchange of the $Na^+$ ions on the surface with a desired alkyl quaternary ammonium halide or sulfate, for example, exchange of $Na^+$ cation with hexadecyl trimethylammonium cation $[CH_3—(CH_2)_{15}]N^+$ $(CH_3)_3$, using hexadecyl trimethylammonium bromide, and subsequent removal of unreacted organic material with alcohol, filtration, and drying to recover surface modified montmorillonite nano-filler.

Various constituents of the solvent-free uv-curable organic-inorganic composite compositions according to this invention are formulated with the following relative (weight %):

polymeric/oligomeric binder system, 25–55%;
acrylic monomer (mono-functional, bifunctional or a combination), 10–25%;
multifunctional acrylate monomer/oligomer, 10–25%;
uv polymerization initiator, 1–5%;
inorganic filler, 10–40%, preferably 15–30%; and/or
organically surface modified nanoclay filler, 1–15%, preferably 3–10%.

For non-filler compositions the compositions comprise (by weight %):

polymeric/oligomeric binder system, 30 to 60%;
acrylic monomer (non-functional, bifunction or a combination), 10 to 25%;
multifunctional acrylate monomer/oligomer, 10 to 25%; and
uv polymerization initiator, 1 to 5%.

Other additives such as a surface active agent, adhesion promoter, viscosity modifier are added if desired along with a coloring agent to provide contrast, for example, trace amount of Oil Blue N (also called Solvent Blue), Oil Red O or Oil Red EGN can be incorporated.

REPRESENTATIVE EXAMPLES

UV curable compositions were prepared using the following procedure. Unless otherwise specified, all the organic and inorganic materials used in these compositions were obtained from commercial sources and used as-received.

Example 1

Preparation of a UV Curable Composition

Poly(acrylonitrile-co-butadiene-co-acrylic acid) dicarboxy terminated glycidyl methacrylate diester (Structure I, where $R^1$ and $R^2$ are $—COO—CH_2—CH(OH)—CH_2—O—CO—C(R')=CH_2$), and $R'=CH_3$, 3.9 g, was blended into a mixture of 0.9 g trimethylolpropane triacrylate (TMPTA), 0.5 g of propoxylated TMPTA and 0.7 g hydroxyethyl acrylate (HEA), and 0.6 g hydroxyethyl methacrylate (HEMA) by slow addition with stirring till a homogeneous viscous blend was formed. This was followed by the addition and mixing of benzophenone, 0.15 g as a uv polymerization initiator to obtain a uv curable composition (Stock solution). All the materials used in this composition were obtained from Aldrich Chemical Co.

Preparation of a UV Curable Polymer-Filler Composite Composition

To 3.1 g of the Stock solution described above was added 1.2 g of Talc pigment (Nytal-7700, avg. particle size 1.7 um, R.T. Vanderbilt Co., Inc.) in portions with slow mixing after each addition till a homogeneous dispersion was formed. Another polymer-filler dispersion was prepared by blending in Nytal-400 Talc pigment (avg. Particle size 4.6 um) in a stock solution of the same composition as described above.

Preparation of a UV Curable Polymer-Nanofiller Nanocomposite Composition

To 2.9 g of the Stock solution described above in Example 1 was added 0.25 g of the organically modified-mmt., Cloisite 25A (Southern Clay Products), in portions with slow mixing after each addition until a homogeneous essentially transparent dispersion was formed. A similar polymer-nanofiller composition was prepared by blending in Cloisite 30B which is another organically modified-mmt. nanoclay also available from Southern Clay Products.

To provide color contrast in application of these compositions for the purposes according to this invention, trace amount of a coloring agent such as a dye, for example, Oil Blue N, also referred to as Solvent Blue 14, was added to the compositions described above. Alternatively, a red dye such as Oil Red EGN or Oil Red O can also be used. The uv-curable compositions of Example 1 were tested for compatibility with the processing conditions typically used in microelectronics bond and assembly operations as given in the following Each of the uv-curable compositions of Example 1 dispensed onto glass slides was subjected to uv exposure for 1–2 minutes with the exposure carried out using as the radiation source an Argus 7312 Series UV Processor with UV Source 350 WPI having a medium pressure Hg Arc Lamp (sold by Argus International), followed by optional post exposure bake up to 250° C. to provide a hard scratch resistant coating having good adhesion to the substrate. The cured coatings were tested for resistance to solvent permeation with high temperature Rosin flux such as alpha-102–1500 flux in benzyl alcohol and xylene by placing the flux solution over the uv cured material for about 15 to about 60 minutes, then placing the Pb/Sn solder balls over the flux and rapid temperature ramping up to solder melt temperature, followed by cooling to room temerature and subjecting to flux cleaning process using xylene and IPA. Visual and microscopic inspection showed no change in the uv cured material and showed no problem of dissolution, cracking/crazing or delamination. With the compositions where Oil Blue dye had been added, it was noticed that the color changed to yellow after the uv-curing step and it essentially remained unchanged during the subsequent process exposures.

Method of Repairing Electronic Assembly Product Defects with the UV-Curable Compositions Described in Example 1:

(a) High circuit density ceramic electronic modules with multiple levels of thin film structure which had defects in the ceramic flange area on top side such as hoop-cracks, chipped ceramic, and depressions, are repaired and recovered by the following method using the compositions of example 1:

A uv-polymerizable (or curable) solvent-free composition is dispensed over the defect site, cured by uv exposure for 1–2 minutes in a uv-curing oven which gave fully cured, hard and scratch resistant deposit over the defect site providing permanent sealing and micopassivation of the defects. The cured products from the stock mixture (without the filler) and from the organic constituents-Cloisite 25A (or Cloisite 30B) nanoclay dispersion were both essentially transparent while the composition with Talc filler gave an opaque material after uv curing.

The top side flange is needed to hermetically seal or cap the package circuitry for protection from mechanical damage and the detrimental effects of environmental damage. Without repair of the flange related defects, the modules are rejected as these do not meet the ceramic flange manufacturing specifications. After uv curing, the coatings are optionally subjected to thermal curing to crosslink any residual reactive species. The uv-cured products were tested for compatibility with all the bond and assembly processing requirement which include: exposure to rosin flux, a few minute exposure to high temperature chip join conditions up to 320–350° C., to low temperature soldering process, flux residue cleaning solvents for example xylene cleaning at 80–90° C. and rinse with isopropanol, adhesion to Au, Pb/Sn solder, polyimide insulator, and to ceramic, laser ablation to expose underlying defect site for engineering changes, and thermal stress induced during reliability test exposure.

(b) To repair any defects in the thin film structure of advanced high density ceramic modules, the uv curable composition is selectively dispensed on the defect site, cured by exposure to uv-radiation as described in (a) above, followed by selective laser ablation of the cured material to open the embedded defect area underneath, and repair of the underlying defect by making engineering change to restore functionality of the electronic device and thereby allowing product reclamation.

Example 2

Preparation of Another UV-Curable Composition

Poly(acrylonitrile-co-butadiene-co-acrylic acid) dicarboxy terminated glycidyl methacrylate diester (Structure I, where R=—COO—$CH_2$—CH(OH)—$CH_2$—O—CO—C(R')=$CH_2$), $R^1$=$CH_3$, 10.2 g, was blended into a mixture of 1.9 g trimethylolpropane triacrylate (TMPTA), 1.5 g of trimethylolpropane propoxylate (PO/OH) triacrylate (TMPPTA), 2.1 g of 2-hydroxyethyl acrylate (HEA), 0.8 g of 2-hdroxyethyl methacrylate (HEMA), and 0.5 g glycidyl methacrylate by slow addition with stirring till a homogeneous viscous blend was formed. This was followed by the addition and mixing of benzophenone, 0.5 g as a uv polymerization initiator and 0.04 g of glycidoxypropyl trimethoxysilane as an adhesion promoter to obtain a uv curable composition (Stock solution). All the materials used in this composition were obtained from Aldrich Chemical Co.

Preparation of a Polymer-Filler Composite from the UV-Curable Composition of Example 2

To 6.9 g of the Stock solution of Example 2 described above was added 2.6 g of a Talc pigment (Nytal-400, purchased from R. T. Vanderbit Co., Inc.) in portions with slow mixing after each addition till a homogeneous dispersion was formed.

Similarly, a uv-curable polymer-nanofiller nanocomposite formulation was prepared by blending 0.55 g of the organically modified-mmt., Cloisite 25A (Southern Clay Products), into 6.1 g of the uv-curable composition of Example 2 by slow addition and mixing of the filler after each addition resulting in a homogeneous essentially transparent dispersion. These formulations were tested as described above in Example 1, for compatibility with the various bond and assembly processes commonly used in microelectronics fabrication and found to meet all the processing and performance requirements.

Example 3

Poly(acrylonitrile-co-butadiene) amine terminated difunctional amine oligomer, 10 wt % acrylonitrile segments in the polymer (Structure II, where R=—CONH—CH2—CH2—NC4H8NR', where R'=H, 2.5 g was blended into a mixture of 0.2 g glycidyl methacrylate, 0.6 g trimethylolpropane triacrylate (TMPTA), 0.2 g trimethylolpropane propoxylate (PO/OH) triacrylate (TMPPTA), 0.3 g 2-hydroxyethyl acrylate (HEA), 0.2 g of 2-hdroxyethyl methacrylate (HEMA), and 0.35 g ethyleneglycol methyl ether methacrylate by slow addition with stirring till a homogeneous viscous blend was formed after which 0.085 g of benzoin as a uv polymerization initiator was mixed in to form a uv-curable composition (Stock solution).

A uv-curable polymer-filler composition using the above stock solution was prepared by blending 0.4 g of Nytal-7700 Talc pigment (Vanderbilt Co., Inc.) into 2.1 g of the above described composition by adding the filler in portions and thoroughly mixing after each addition till a homogeneous dispersion was formed. Another polymer-filler dispersion using the composition of Example 3 was prepared by blending silane surface modified silica to form silica filled uv-curable formulation. Similarly, uv-curable nanocomposites were prepared using the stock composition of Example 3 and organically modified nanoparticle filler and forming dispersion according to the method described in Example 1. For providing color contrast, a coloring agent such as the dye described in Example 1 was added to the original stock composition and the polymer-filler composite formulations derived therefrom.

These formulations were tested as described above in Example 1, for compatibility with the various bond and assembly processes commonly used in microelectronics fabrication and found to meet all the processing and performance requirements.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention,

What is claimed is:

1. A solvent-free, radiation-curable composition comprising a polymer binder, which is a reactive pre-formed thermoplastic or elastomeric polymer/oligomer having reactive functional groups, a monofunctional and/or bifunctional acrylic monomer, a multifunctional (more than 2 reactive groups) acrylated/methacrylated monomer, and a photoinitiator, where all the constituents are mutually miscible forming a homogeneous viscous blend without the addition of an organic solvent and wherein the composition including the reactive functional groups of the polymer/oligomer is polymerized to form a cured matrix.

2. The composition of claim 1 which further contains an inorganic filler.

3. The composition of claim 1 which further contains a nanoparticle filler.

4. The composition of claim 1 wherein the organic polymeric/oligomeric binder is a poly(acrylonitrile-co-butadiene-co-acrylic acid) having reactive terminal functional groups represented by the chemical structure I;

Structure I:

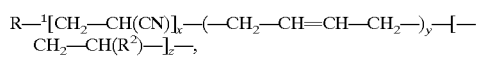
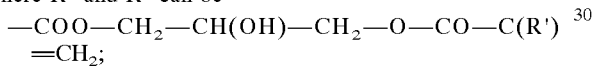

where $R^1$ and $R^2$ can be

—COO—CH$_2$—CH(OH)—CH$_2$—O—CO—C(R')=CH$_2$;

—COOH; and

—COOR";

or mixtures thereof; and where R is H or CH$_3$ and R" is an organic radical represented by C$_n$H$_{2n+1}$, n=1 to 4.

5. The composition of claim 1 wherein the organic polymeric/oligomeric binder is a poly(acrylonitrile-co-butadiene) amine terminated, or a dicarboxy terminated oligomeric elastomer represented by chemical structure II;

Structure II:

where $R^3$ and $R^4$ can be

—CONH—CH$_2$—CH$_2$—NC4H8NR';

—COOH, and

—COOR";

or mixtures thereof;

and R' is H or CH$_3$; and where R" is an organic radical represented by C$_n$H$_{2n+1}$, n=1 to 4.

6. The composition of claim 1 wherein the organic polymeric/oligomeric binder is a polybutadiene epoxy/hydroxy functionalized, represented by chemical structure III;

Structure III:

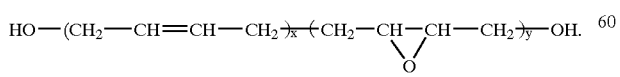

7. The composition of claim 1 wherein the organic polymeric/oligomeric binder is an acrylate polymer.

8. The composition of claim 7 wherein the acrylate polymer is poly(styrene-co-butyl methacrylate-co-ethyl methacrylate); poly(methyl vinyl ether); poly(ethyl acrylate-glycidyl methacrylate-methacrylic acid-methyl methacrylate), poly(styrene-glycidyl methacrylate-ethyl acrylate) and mixtures thereof.

9. The composition of claim 1 wherein the monofunctional and/or bifunctional acrylic monomer is selected from the group consisting of hydroxyethyl acrylate, glycidyl methacrylate, hydroxyethyl methacrylate ethoxylated bisphenol-A-diacrylate, 2,2 bis(4-methacryloxyphenyl) propane and mixtures thereof.

10. The composition of claim 1 wherein the polyfunctional acrylate monomer (having more than 2 functional groups) is selected from the group consisting of trimethyloipropane triacrylate (TMPTA), trimethylolpropane tri methacrylate (IMPTMA), propoxylated tri methylol propane triacrylate PO/OH TMPTA), pentaerythritol tetracrylate, di pentaerythritol pentaacrylate and mixtures thereof.

11. A method for repairing and/or fabricating electronic components comprising the steps of:

applying to an electronic component a solvent-free, radiation-curable composition comprising a reactive pre-formed thermoplastic or elastomeric polymer/oligomer having reactive functional groups, a monofunctional and/or bifunctional acrylic monomer, a multifunctional (more than 2 reactive groups) acrylated/methacrylated monomer, and a photoinitiator, where all the constituents are mutually miscible forming a homogeneous viscous blend without the addition of an organic solvent and wherein the composition including the reactive functional groups of the polymer/oligomer is polymerized to form a cured matrix; and curing the composition.

12. The method of claim 11 wherein the composition further contains an inorganic filler.

13. The method of claim 11 wherein the composition further contains a nanoparticle filler.

14. The method of claim 11 wherein the organic polymeric/oligomeric binder is a poly(acrylonitrile-co-butadiene-co-acrylic acid) having reactive terminal functional groups represented by the chemical structure I;

Structure I:

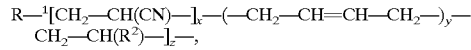
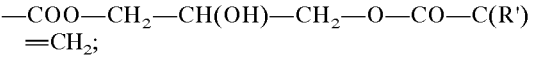

where $R^1$ and $R^2$ can be

—COO—CH$_2$—CH(OH)—CH$_2$—O—CO—C(R')=CH$_2$;

—COOH; and

—COOR";

or mixtures thereof; and where R is H or CH$_3$ and R" is an organic radical represented by C$_n$H$_{2n+1}$, n=1 to 4.

15. The method of claim 11 wherein the organic polymeridoligomeric binder is a poly(acrylonitrile-co-butadiene) amine terminated or a dicarboxy terminated oligomeric elastomer represented by chemical structure II;

Structure II:

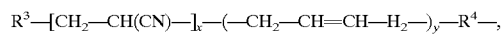

where $R^3$ and $R^4$ can be

—CONH—CH$_2$—CH$_2$—NC4H8NR';

—COOH; and

—COOR";

or mixtures thereof;
and R' is H or $CH_3$; and
where R" is an organic radical represented by $C_nH_{2n+1}$, n=1 to 4.

16. The method of claim 11 wherein the organic polymeric/oligomeric binder is a polybutadiene epoxy/hydroxy functionalized, represented by chemical structure III, and mixtures thereof;

Structure III:

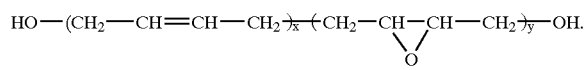

17. The method of claim 11 wherein the organic polymeric/oligomeric binder is an acrylate polymer.

18. The method of claim 11 wherein the acrylate polymer is selected from the group consisting of poly(styrene-co-butyl methacrylate-co-ethyl methacrylate); poly(methyl vinyl ether); poly(ethyl acrylate-glycidyl methacrylate-methacrylic acid-methyl methacrylate), poly(styrene-glycidyl methacrylate-ethyl acrylate) and mixtures thereof.

19. The method of claim 11 wherein the monofunctional and/or bifunctional acrylic monomer is selected from the group consisting of hydroxyethyl acrylate, glycidyl methacrylate, hydroxyethyl methacrylate, ethoxylated bisphenol-A-diacrylate, 2,2 bis(4-methacryloxyphenyl) propane and mixtures thereof.

20. The method of claim 11 wherein a polyfunctional acrylate monomer (having more than 2 functional groups) is selected from the group consisting of trimethylolpropane triacrylate (TMPTA), trimethylolpropane tri methacrylate (TMPTMA), propoxylated tri methylolpropane triacrylate PO/OH TMPTA), pentaerythritol tetracrylate, dipentaerythritol pentaacrylate and mixtures thereof.

\* \* \* \* \*